US009824880B2

(12) United States Patent
Sato

(10) Patent No.: US 9,824,880 B2
(45) Date of Patent: Nov. 21, 2017

(54) METHOD OF POLISHING SILICON WAFER AND METHOD OF PRODUCING EPITAXIAL WAFER

(71) Applicant: SHIN-ETSU HANDOTAI CO., LTD., Tokyo (JP)

(72) Inventor: Hideki Sato, Tomioka (JP)

(73) Assignee: SHIN-ETSU HANDOTAI CO., LTD, Tokyo (JP)

(*) Notice: Subject to any disclaimer, the term of this patent is extended or adjusted under 35 U.S.C. 154(b) by 151 days.

(21) Appl. No.: 14/779,111

(22) PCT Filed: Mar. 13, 2014

(86) PCT No.: PCT/JP2014/001420
§ 371 (c)(1),
(2) Date: Sep. 22, 2015

(87) PCT Pub. No.: WO2014/171059
PCT Pub. Date: Oct. 23, 2014

(65) Prior Publication Data
US 2017/0194136 A1    Jul. 6, 2017

(30) Foreign Application Priority Data

Apr. 18, 2013 (JP) ................................. 2013-087732

(51) Int. Cl.
*H01L 21/461* (2006.01)
*H01L 21/02* (2006.01)
(Continued)

(52) U.S. Cl.
CPC ...... *H01L 21/02052* (2013.01); *H01L 21/304* (2013.01); *C11D 11/0047* (2013.01)

(58) Field of Classification Search
CPC .... C08F 10/00; C08F 2/01; C08F 2/34; C08F 2/001; C08F 10/14; C08F 110/06;
(Continued)

(56) References Cited

U.S. PATENT DOCUMENTS 6,030,491 A     2/2000  Vaartstra
2006/0151854 A1*  7/2006  Kawase ................... C09G 1/02
                                                 257/617
(Continued)

FOREIGN PATENT DOCUMENTS

CN      101325152 A     12/2008
JP      H06-314679 A    11/1994
(Continued)

OTHER PUBLICATIONS

Dec. 15, 2015 Office Action issued in Taiwanese Patent Application No. 103111807.
(Continued)

*Primary Examiner* — Robert Bachner
(74) *Attorney, Agent, or Firm* — Oliff PLC

(57) ABSTRACT

A method of polishing a silicon wafer, including performing a mirror polishing process on the silicon wafer, the mirror polishing process including: performing rough polishing on the silicon wafer; subsequently removing metallic impurities attached on a surface of the silicon wafer by performing both an oxidation process with ozone gas or ozone water and an oxide-film removing process with hydrofluoric acid vapor or hydrofluoric acid solution on the surface of the silicon wafer; and then performing final polishing. The invention provides a method of polishing a silicon wafer and a method of producing an epitaxial wafer that can prevent the occurrence of PID in the silicon wafer due to a mirror-polishing process and the degradation of surface quality of the silicon wafer after the mirror-polishing process and the epitaxial
(Continued)

wafer having an epitaxial layer stacked thereon in a subsequent process.

8 Claims, 6 Drawing Sheets

(51) Int. Cl.
*H01L 21/304* (2006.01)
*C11D 11/00* (2006.01)

(58) Field of Classification Search
CPC ........ C08F 210/06; C08F 6/02; C08F 110/14;
C08F 210/16; C08F 2500/02; C08F
2500/17; C08F 2/42; C08F 4/65925;
C08F 14/18
See application file for complete search history.

(56) References Cited

U.S. PATENT DOCUMENTS

| | | |
|---|---|---|
| 2008/0308122 A1 | 12/2008 | Schwab et al. |
| 2010/0090314 A1 | 4/2010 | Iizuka et al. |
| 2010/0093177 A1 | 4/2010 | Kozasa et al. |
| 2012/0100701 A1* | 4/2012 | Kawasaki ......... H01L 21/02052 438/478 |

FOREIGN PATENT DOCUMENTS

| | | |
|---|---|---|
| JP | 2006108151 A | 4/2006 |
| JP | 2008205147 A | 9/2008 |
| JP | 2010165960 A | 7/2010 |
| JP | 2011101930 A | 5/2011 |
| JP | 2012028796 A | 2/2012 |
| JP | 2012109310 A | 6/2012 |
| TW | 200416275 A | 9/2004 |
| WO | 2010150547 A1 | 12/2010 |

OTHER PUBLICATIONS

Dec. 22, 2016 Office Action issued in Chinese Patent Application No. 201480021816.0.

Jun. 3, 2014 International Search Report issued in International Patent Application No. PCT/JP2014/001420.

Oct. 20, 2015 International Report on Patentability issued in International Patent Application No. PCT/JP2014/001420.

Jul. 12, 2017 Office Action issued in Chinese Application No. 201480021816.0.

* cited by examiner (A)

(B)

(A)　　　　　　　　　　(B)

METHOD OF POLISHING SILICON WAFER AND METHOD OF PRODUCING EPITAXIAL WAFER

TECHNICAL FIELD

The present invention relates to a method of polishing a silicon wafer and a method of producing an epitaxial wafer.

BACKGROUND ART

It has been known that irregularities of an epitaxial layer that are created in an epitaxial growth process of a semiconductor silicon wafer are due to its scratches or its polishing induced defects (PIDs) that occur in a previous mirror-polishing process.

The scratches of a surface of the wafer after the mirror polishing are accompanied with dislocations, which are crystal defects. If epitaxial growth is performed on this wafer with the scratches, then the dislocations are propagated to the epitaxial layer to create dislocations also in the epitaxial layer, resulting in inferior quality of the epitaxial layer. It is therefore important that the wafer before the epitaxial growth after the mirror polishing has no scratch.

FIG. 7 shows captured epitaxial defects in an epitaxial layer that are generated in the epitaxial growth on a wafer (a polished wafer) after mirror polishing with damage such as a scratch. An enlarged view at the lower left shows damage lying at near the boundary between the epitaxial layer and a substrate.

When epitaxial growth is performed on PID, a projection part (a projection) influenced by the shape of the PID can be observed on the outermost surface of the epitaxial layer. It can be also observed that there is no defect such as a dislocation in the interior of the epitaxial layer right under this projection part, and the epitaxial layer has no disturbance of its crystallinity.

FIG. 8(A) shows an image of PID observed on a polished wafer with a laser microscope (MAGICS made by Lasertec Corporation). FIG. 8(B) shows an image of observation at the same coordinates as the PID after epitaxial growth is performed thereon. As shown in the image after the epitaxial growth, a projection due to the PID can be seen.

FIG. 9 shows the cross section of an epitaxial layer with a convex shape observed by a transmission electron microscope (TEM) at the same coordinates as PID after epitaxial growth is performed on a wafer having the PID. This result reveals that although the epitaxial layer has no defect, the outermost surface of the epitaxial layer is convex upward over a width of 200 nm and its height is about 2 to 3 nm.

In conventional techniques, defects such as scratches can be reduced if a mirror-polishing stock removal is sufficiently ensured.

PIDs, on the other hand, are usually reduced under conditions that a polishing apparatus and a polishing pad are well managed by various methods, for example, as disclosed in Patent Document 1. Exemplary techniques employed on the PIDs also include cleaning just before epitaxial growth after mirror polishing as disclosed in Patent Document 2.

CITATION LIST

Patent Literature

Patent Document 1: Japanese Unexamined Patent publication (Kokai) No. 2008-205147
Patent Document 2: International Publication No. WO2010/150547

SUMMARY OF INVENTION

Technical Problem

As described previously, countermeasures as disclosed in Patent Documents 1 and 2 are conventionally used against PID. These are insufficient to prevent degradation of surface quality of a polished wafer and an epitaxial wafer including an epitaxial layer formed on the polished wafer.

In view of this, the present inventor investigated PID.

PID on a surface of a silicon wafer that was sliced from a silicon ingot, ground, and then mirror polished was first observed directly by scanning electron microscopy (SEM) and analyzed by energy dispersive X-ray spectroscopy (EDX). A peak of generated X-ray that indicated metal was consequently detected from a portion of the PID.

In an example shown in FIG. 3(A), Zr metallic impurities (2.042 keV) in addition to silicon were detected. In an example shown in FIG. 3(B), Ni metallic impurities (0.851 keV) were detected.

It is to be noted that when the same analysis was conducted at shallow cracked and scratched portions, peaks indicating metal likewise were obtained.

Ni metallic impurities were detected in the scratch shown in FIG. 4.

The cross-sectional structure of the PID was next observed by TEM to advance the investigation of PID. The EDX analysis revealed that about 2 nm of an upper layer portion among the PID with a height of 3 to 6 nm was an attached metallic substance.

FIG. 5(A) shows an image of PID by SEM; FIG. 5(B) shows an image of the cross section of this PID by TEM observation; FIG. 5(C) shows an enlarged view thereof. FIG. 5(D) shows the result of EDX analysis of the outermost surface layer of the PID. As shown in this result of EDX analysis, Zr was detected in a surface layer portion of the PID.

It is to be noted that other metals detected in this investigation were Fe, Ni, and Zr.

These results correspond to the analysis results of abrasive grains and the components of a grinding stone. Table 1 shows analysis of the components of the grinding stone.

TABLE 1

| ELEMENT | ANALYZED VALUE (ppm) |
|---|---|
| Al | 880 |
| Cr | 64 |
| Fe | 430 |
| Ni | 5.7 |
| Cu | 100 |
| Zr | 98 |

An assumed mechanism through which the above metallic impurities are attached to PID will be described below. The outline of this mechanism is shown in FIG. 6.

A silicon single crystal is first sliced into wafers with a wire saw. This process damages the wafer by a slicing wire, abrasive grains of a slurry, and its pressure.

After cleaning, an etching process for removing damage due to processing is performed by using acid or alkali solution so that this damage is forcibly removed. At this time, part of the damage may remain, or an extending crack produced during the slicing may remain.

A grinding process with a grindstone or abrasive grains, or a lapping process, or both is then performed to remove residual damage. This process removes part of the residual damage but creates new damage. Thus, the residual damage created during the slicing process and the damage created by grinding or lapping remain as mixed damage. A subsequent process follows cleaning.

The metallic impurities are taken in a gap in this mixed damage. When the residual damage is removed in a subsequent polishing process, the metallic impurities appear in a surface layer. Accordingly, the polishing stock removal partially varies due to a difference in hardness between metal and silicon, resulting in the occurrence of PID. These are the inventor's assumptions.

The present inventor predicted that although metallic impurities may usually be removed by various cleaning processes, all the metallic impurities are not necessarily be removed because no sufficient convection of a cleaning liquid may occur depending on a tiny gap in created damage or its structure. This is also presumed from the fact that Ni was detected in a scratch on a wafer surface in an exemplary SEM-EDS analysis in the past.

The cleaning method after the mirror-polishing process disclosed in Patent Document 2, for example, may remove PID itself, but then forms the wafer surface into a concave shape. Depending on the concave shape, an epitaxial defect, which is followed by a dislocation, may be induced during subsequent epitaxial growth. The cleaning method in Patent Document 2 is thus insufficient as a countermeasure against PID.

The present invention was accomplished in view of the above-described problems. It is an object of the present invention to provide a method of polishing a silicon wafer and a method of producing an epitaxial wafer that can prevent the occurrence of PID in the silicon wafer due to a mirror-polishing process and the degradation of surface quality of the silicon wafer after the mirror-polishing process and the epitaxial wafer having an epitaxial layer stacked thereon in a subsequent process.

Solution To Problem

To achieve this object, the present invention provides a method of polishing a silicon wafer, comprising performing a mirror polishing process on the silicon wafer, the mirror polishing process including: performing rough polishing on the silicon wafer; subsequently removing metallic impurities attached on a surface of the silicon wafer by performing both an oxidation process with ozone gas or ozone water and an oxide-film removing process with hydrofluoric acid vapor or hydrofluoric acid solution on the surface of the silicon wafer; and then performing final polishing.

This inventive polishing method can forcibly eliminate the metallic impurities attached on the surface of the silicon wafer after the rough polishing by the forcible oxidation with ozone gas or water and the removal together with the oxide film with hydrofluoric acid vapor or solution.

In the subsequent final polishing, there is therefore no difference in hardness, which is a factor in the occurrence of PID, of the surface of the silicon wafer due to the difference between silicon and metal. The final polishing can thereby be done with high uniformity. In this way, a flat, high quality polished wafer with no PID can be produced.

In addition, since such a high quality polished wafer can be obtained, when an epitaxial layer is stacked in a subsequent process, an epitaxial wafer having excellent surface quality and no projection due to PID on its surface can be obtained.

Moreover, the silicon wafer after the removal of the metallic impurities may be subjected to an RCA cleaning process.

In this way, organic particles and metallic particles on the wafer surface can be removed.

Moreover, the silicon wafer after the final polishing may be subjected to a final cleaning process.

In this way, various kinds of particles on the wafer surface after the final polishing can be removed.

Furthermore, the present invention provides a method of producing an epitaxial wafer comprising: performing the mirror polishing process by the above polishing method on a surface of a silicon wafer; and forming an epitaxial layer on the surface of the silicon wafer.

Such a method of producing an epitaxial wafer can form the epitaxial layer on a polished wafer in which the occurrence of PID is inhibited, thereby obtaining an epitaxial wafer having excellent surface quality in which the occurrence of a projection due to PID is inhibited.

Advantageous Effects of Invention

According to the present invention as above, the mirror polishing process can remove the metallic impurities attached on a surface of a silicon wafer and obtain a flat, high quality polished wafer in which the occurrence of PID is inhibited, after final polishing. In addition, the invention can obtain an epitaxial wafer having excellent surface quality in which the occurrence of a projection due to PID is inhibited.

DESCRIPTION OF EMBODIMENTS

An embodiment of the present invention will hereinafter be described in detail with reference to the drawings, but the present invention is not limited to this embodiment.

The present inventor diligently studied PID on a surface of a silicon wafer, and consequently found the following. Metallic impurities are taken in mixed damage created during slicing, grinding, and lapping processes. During a mirror-polishing process to remove this mixed damage, PID is produced because polishing stock removal partially varies due to the difference in hardness between metal and silicon.

The cleaning method as disclosed in, for example, Patent Document 2 forms a polished wafer after cleaning into a concave shape, thereby inducing an epitaxial defect, which is followed by a dislocation, during subsequent epitaxial growth. This method is therefore insufficient as a countermeasure against PID.

The inventor also thought of removing the metallic impurities by a process with ozone gas and other processes before final polishing after rough polishing. This method can inhibit the occurrence of PID, thereby enabling acquisition of a polished wafer and an epitaxial wafer that have high surface quality and no concave shape as above. The inventor found this effect and thereby brought the invention to completion.

Figure 1:
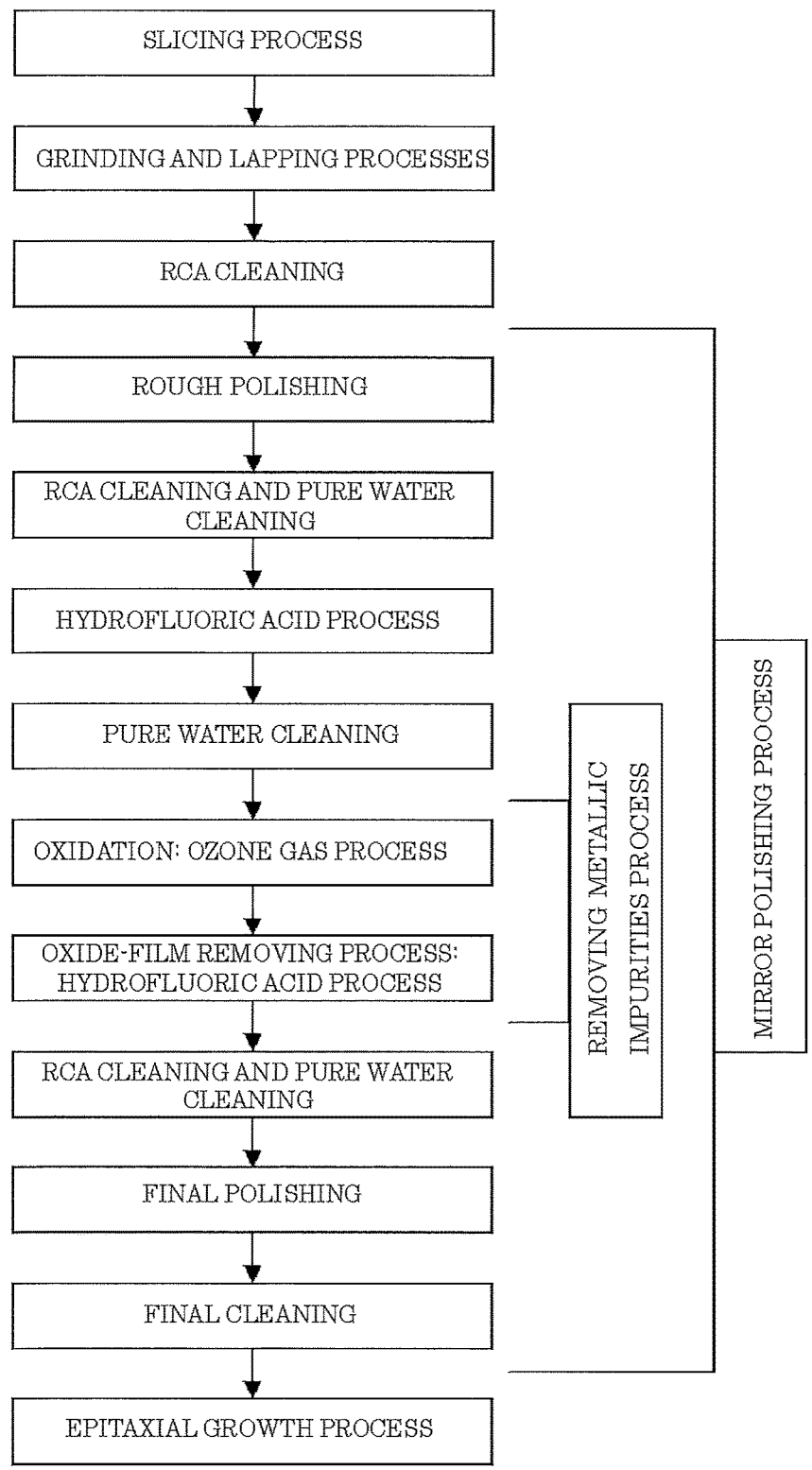
FIG. 1 is an exemplary flowchart of processes in the inventive method of polishing a silicon wafer and the inventive method of producing an epitaxial wafer.

FIG. 1 is an exemplary flowchart of processes in the inventive method of polishing a silicon wafer and the inventive method of producing an epitaxial wafer.

(Slicing Process)

A silicon ingot produced by the Czochralski method or another method is sliced into wafers with a wire saw.

(Grinding and Lapping Processes)

The sliced wafer obtained is etched to remove damages by the process and then subjected to a grinding process or a lapping process or both processes.

It is to be noted that cleaning may be performed before and after these processes as necessary. As shown in FIG. 1, for example, RCA cleaning may be performed after the grinding and lapping processes. This can remove organic particles, metallic particles and other particles on the wafer surface.

(Mirror-Polishing Process)

<Rough Polishing>

A mirror-polishing process is then performed. In this mirror-polishing process, rough polishing is first performed.

In the rough polishing, for example, the silicon wafer supported by a wafer supporting plate of a polishing head is brought into contact with a polishing pad attached to a rotatable turn table under a proper pressure to polish the silicon wafer. This polishing uses an alkali solution (also referred to as a polishing slurry or a polishing agent) containing colloidal silica. Supplying this polishing agent to a contact surface between the polishing pad and the silicon wafer brings about mechanochemical reaction of the polishing slurry and the silicon wafer and thereby the polishing proceeds.

Either a double-side polishing apparatus or a single-side polishing apparatus can be used as a polishing apparatus. Various conditions such as the composition and temperature of the polishing slurry, a polishing pressure, polishing stock removal, and a polishing rate are not particularly limited.

The rough polishing may be a single-stage polishing or multiple-stage polishing. The rough polishing can be performed by stages, for example, two stages such that a second polishing uses a finer polishing agent and a smoother polishing pad than those in a first polishing.

<RCA Cleaning and Pure Water Cleaning>

After the rough polishing thus performed, organic particles, metallic particles, etc., on the surface of the wafer are removed by RCA cleaning. Rinsing is then performed with pure water (pure water cleaning). This rinsing process may be performed by either an overflow method including immersion while flowing water in a batchwise manner, or a spraying method.

<Hydrofluoric Acid Process and Pure Water Cleaning>

A silicon oxide on the wafer surface is removed by immersion into hydrofluoric acid solution or spray of hydrofluoric acid solution. This hydrofluoric acid solution may be used with a concentration of, for example, about 1 to 5%; but is not particularly limited to this concentration. This concentration is preferably 5% or less to effectively prevent the attachment of new particles due to higher hydrofluoric acid concentration than needed from being promoted. The time for the immersion into hydrofluoric acid solution and the time for the spray of hydrofluoric acid solution can be changed depending on the concentration. An exemplary estimated time may be determined such that the surface of the silicon wafer has water repellence. The time for the immersion and spray is preferably determined to be minimum needed to have the water repellence because a longer time for the immersion and spray may promote the attachment of particles.

Rinsing is then performed with pure water. The silicon wafer is dried by spin dry, IPA dry, or another.

<Metallic Impurities Removing Process>

The metallic impurities attached to the surface of the silicon wafer is then removed.

This process described here includes an oxidation process with ozone gas (or ozone water) and an oxide-film removing process with hydrofluoric acid solution (or hydrofluoric acid vapor).

After the rough polishing, the surface of the cleaned silicon wafer is first oxidized with ozone gas. At this time, silicon in the silicon wafer surface, including a portion at which metallic impurities buried in the mixed damage, the scratch, and a micro crack are attached, is forcibly oxidized to form a silicon oxide film thereon. The growth rate of the silicon oxide film is apt to increase especially around these attachments. This silicon oxide film is formed so as to involve these attachments.

The time for the forcible oxidation by the ozone gas is not particularly limited; if the time is one minute or more, then a more sufficient silicon oxide film can be formed; the time is more preferably three minutes or more.

The forcible oxidation by the ozone gas is preferably performed in a sealed container while the ozone gas is continuously supplied, but not limited thereto. Use of a method of directly spraying the ozone gas on the surface of the silicon wafer in an open container can also exert the same effect.

The above effect of the forcible oxidation can be obtained not only by use of ozone gas but also by use of ozone water.

Although either the ozone gas or the ozone water may thus be used, the ozone gas is more preferably used because it is easy to diffuse into fine scratches.

The attachments of the metallic impurities, together with the silicon oxide grown on a surface layer of the silicon wafer by the forcible oxidation, are then removed by immersion into hydrofluoric acid solution or spray of hydrofluoric acid solution.

This effect can be obtained not only by hydrofluoric acid solution but also by hydrofluoric acid vapor.

Although either hydrofluoric acid solution or hydrofluoric acid vapor may thus be used, spraying hydrofluoric acid solution on the silicon wafer surface is more preferable, considering that the metallic impurities are removed from the wafer surface to the exterior of a system.

<RCA Cleaning and Pure Water Cleaning>

After the metallic impurities are thus removed, rinsing is performed with pure water. A subsequent final polishing preferably follows under an immersing condition so that the attachment of environmental particles in air is prevented.

After the removal of the metallic impurities, the rinsing with pure water can alternatively be performed after RCA cleaning is performed. In this way, the subsequent final polishing can be performed after the particles on the silicon wafer surface are more effectively removed.

<Final Polishing>

Final polishing is then performed. This final polishing process maintains an amount of stock removal enough to remove a portion including the track of scratches and the depth of micro cracks etc. This stock removal is not particularly limited and changed depending on the previous processes and other factors; the stock removal is preferably 10 nm or more.

Various conditions such as a polishing apparatus to be used, the composition and temperature of the polishing slurry, a polishing pressure, polishing stock removal, and a polishing rate are not particularly limited. These conditions may be the same as conventional conditions and changed every time.

<Final Cleaning>

After the final polishing, final cleaning is performed. The procedure for this final cleaning is not particularly limited and may be properly determined. This embodiment uses RCA cleaning and pure water cleaning. The procedure for this cleaning need only be capable of removing various particles on the wafer surface after the final polishing.

In the invention, the metallic impurities on the silicon wafer surface are removed before the final polishing. In the final polishing, there is accordingly no difference in hardness, which is a factor in the occurrence of PID, of the silicon wafer surface. A flat, high quality polished wafer with uniformly final-polished surface can thereby be obtained. In this wafer, the number of PID is strongly suppressed, after the final polishing.

The inventive polishing method has no need for the cleaning after the mirror polishing process as disclosed in Patent Document 2 and can obtain a polished wafer having excellent surface quality and no concave surface.

(Epitaxial Growth Process)

An epitaxial layer is then formed on the silicon wafer subjected to the above mirror polishing process.

The method of forming the epitaxial layer itself is not particularly limited and may be the same as a conventional method.

For example, the silicon wafer is placed on an epitaxial growth apparatus, and the epitaxial layer can be stacked at temperatures ranging from 1000 to 1300° C. under a $H_2$ atmosphere while a silicide gas such as $SiCl_4$, $SiHCl_3$, $SiH_2Cl_2$, and $SiH_4$ and a dopant gas such as $B_2H_6$ or $PH_3$ are supplied to this atmosphere.

In the invention, the surface of the silicon wafer on which the epitaxial layer is to be formed has no PID because the above mirror polishing process has been performed. In the formation of the epitaxial layer, the generation of a projection due to PID on the surface of the epitaxial layer, which conventionally occurs, can thereby be greatly inhibited. An epitaxial wafer having excellent surface quality can therefore be obtained.

EXAMPLE

The present invention will be more specifically described below with reference to an example and a comparative example, but the present invention is not limited to this example.

Example

The inventive method of polishing a silicon wafer and method of producing an epitaxial wafer were implemented.

As shown in FIG. 1, a CZ silicon ingot was sliced into wafers with a wire saw. Three silicon wafers of the sliced wafers were subjected to a grinding process and RCA cleaning. The mirror polishing process was then performed. Note that silicon wafers having a diameter of 300 mm and a crystal orientation of <100> were used.

In the mirror polishing process, rough polishing was first performed, and then RCA cleaning, pure water cleaning, a hydrofluoric acid process, and pure water cleaning were performed in this order so that a roughly polished silicon wafer was obtained.

The conditions of the rough polishing (a first polishing and a second polishing) are as follows.

A silicon wafer after grinding and lapping was first etched by 20 μm with NaOH as a pretreatment.

Both surfaces of this silicon wafer were then polished by first polishing with a double-side polishing apparatus and a polishing agent of an alkali solution whose main component was colloidal silica. Since a polishing stock removal of at least 10 μm sufficed, the polishing stock removal was determined to be 10 μm in this polishing. Urethane foam was used for a polishing pad.

Then, the second polishing with a polishing stock removal of about 1 μm was similarly performed by using a single-side polishing apparatus with a polyurethane nonwoven fabric polishing pad and an NaOH-based colloidal silica polishing agent.

The silicon wafer after the rough polishing was subjected to a metallic impurities removing process. In this process, the silicon wafer was first placed in a container and ozone gas was continuously supplied to the container to oxidize a surface of the silicon wafer by the ozone gas. This forcible oxidation by the ozone gas was performed for three minutes.

Then, a 1% concentration of hydrofluoric acid solution was prepared. This solution was splayed for one minute to the surface of the silicon wafer to remove the metallic impurities attached to the surface of the silicon wafer together with a silicon oxide film.

This splaying operation for one minutes was repeated twice as the oxide-film removing process.

Pure water cleaning was then performed.

The final polishing was then performed. In this final polishing, the polishing stock removal was regarded as a management criterion such that the polishing amount was enough to ensure a stock removal of 80 nm or more. After this final polishing, RCA cleaning and pure water cleaning were performed, so that a polished wafer was obtained.

It is to be noted that other conditions of the final polishing is as follows.

The final polishing was performed by using a single-side polishing apparatus with a polyurethane suede polishing pad and an NH$_4$OH-based colloidal silica polishing agent.

Note that the polishing rate was 10 nm/min or less; the polishing time was 2.5 minutes.

An epitaxial layer was formed on the surface of the obtained polished wafer. The polished wafer was placed on an epitaxial growth apparatus. The epitaxial layer with a thickness of 3 μm was vapor-phase grown at 1130° C. under a H$_2$ atmosphere while a silicide gas of SiCl$_4$ was introduced into this atmosphere.

An epitaxial wafer was thus obtained.

Comparative Example

A conventional method of polishing a silicon wafer and method of producing an epitaxial wafer were implemented. More specifically, a silicon wafer was polished in the same manner as the above example except that the metallic impurities removing process was not performed so that a polished wafer having a diameter of 300 mm and a crystal orientation of <100> was obtained.

An epitaxial layer was vapor-phase grown on the polished wafer under the same conditions as the example, so that an epitaxial wafer was obtained.

The surface of the silicon wafers after the rough polishing, polished wafers, and epitaxial wafers obtained in the example and comparative example was inspected by a laser microscope (MAGICS made by Lasertec Corporation) to compare to what degree the number of defects that was checked after each polishing was decreased.

Figure 2:
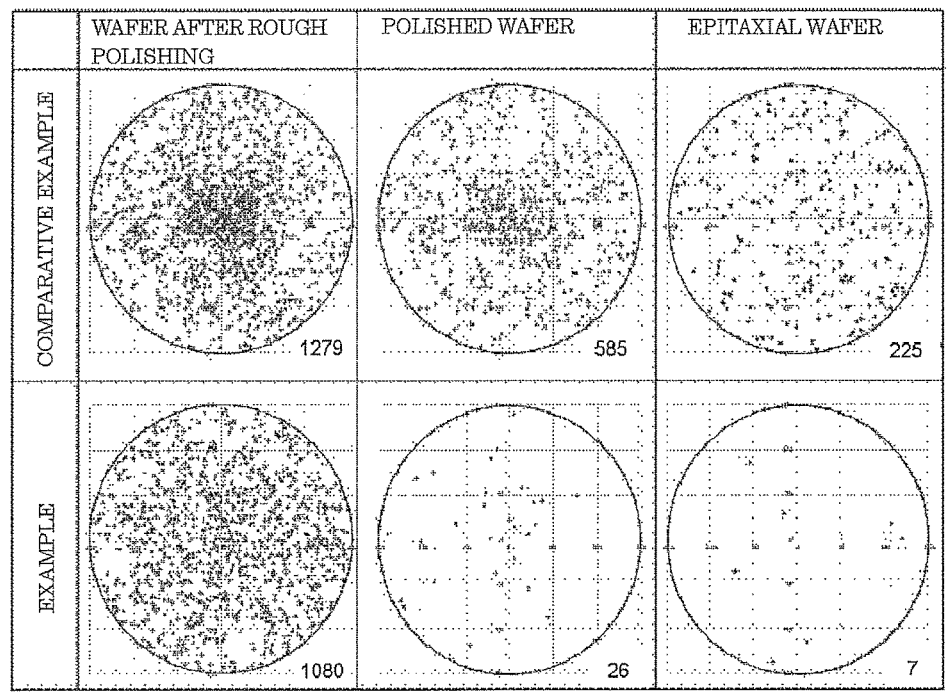
FIG. 2 shows the result of surface inspection of a silicon wafer after rough polishing, a polished wafer, and an epitaxial wafer in Example and Comparative Example.
Figure 3:
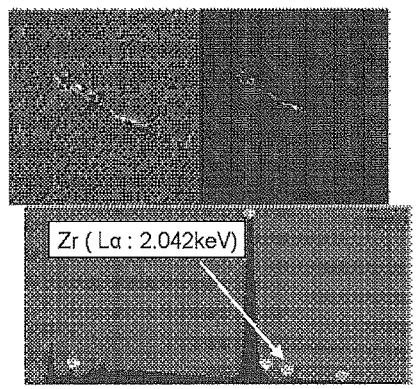
FIG. 3 are measurement diagrams of examples of generated X-ray peaks that indicate metal from PID, in which (A) is an example of the detection of Zr, and (B) is an example of the detection of Ni.
Figure 3:
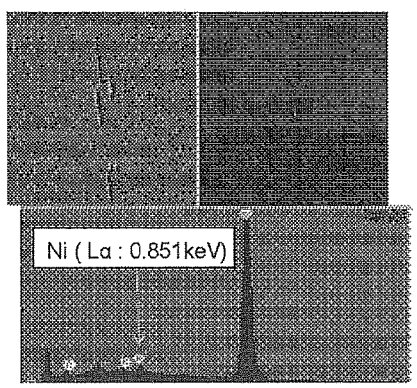
Figure 4:
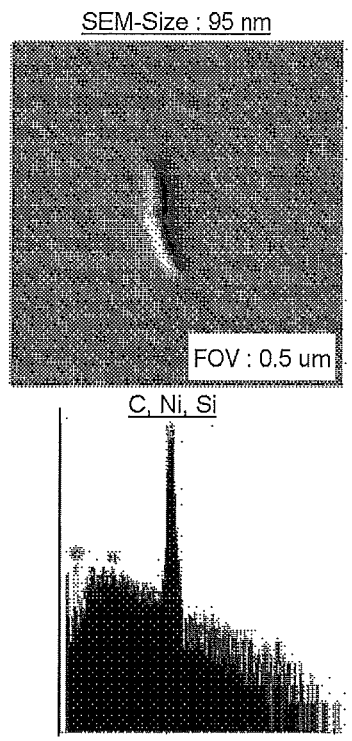
FIG. 4 shows an observation diagram of a scratch and a measurement diagram of an example of a generated X-ray peak that indicates metal (Ni) from the scratch.
Figure 5:
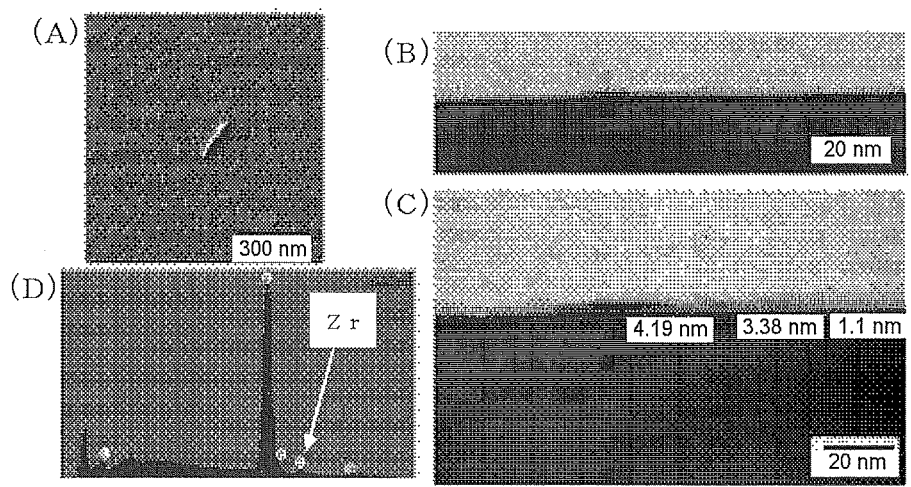
FIG. 5 show an SEM image of PID at (A), an image of the cross section of the PID by TEM observation at (B), an enlarged view thereof at (C), and the result of EDX analysis of the outermost surface of the PID at (D)
Figure 6:
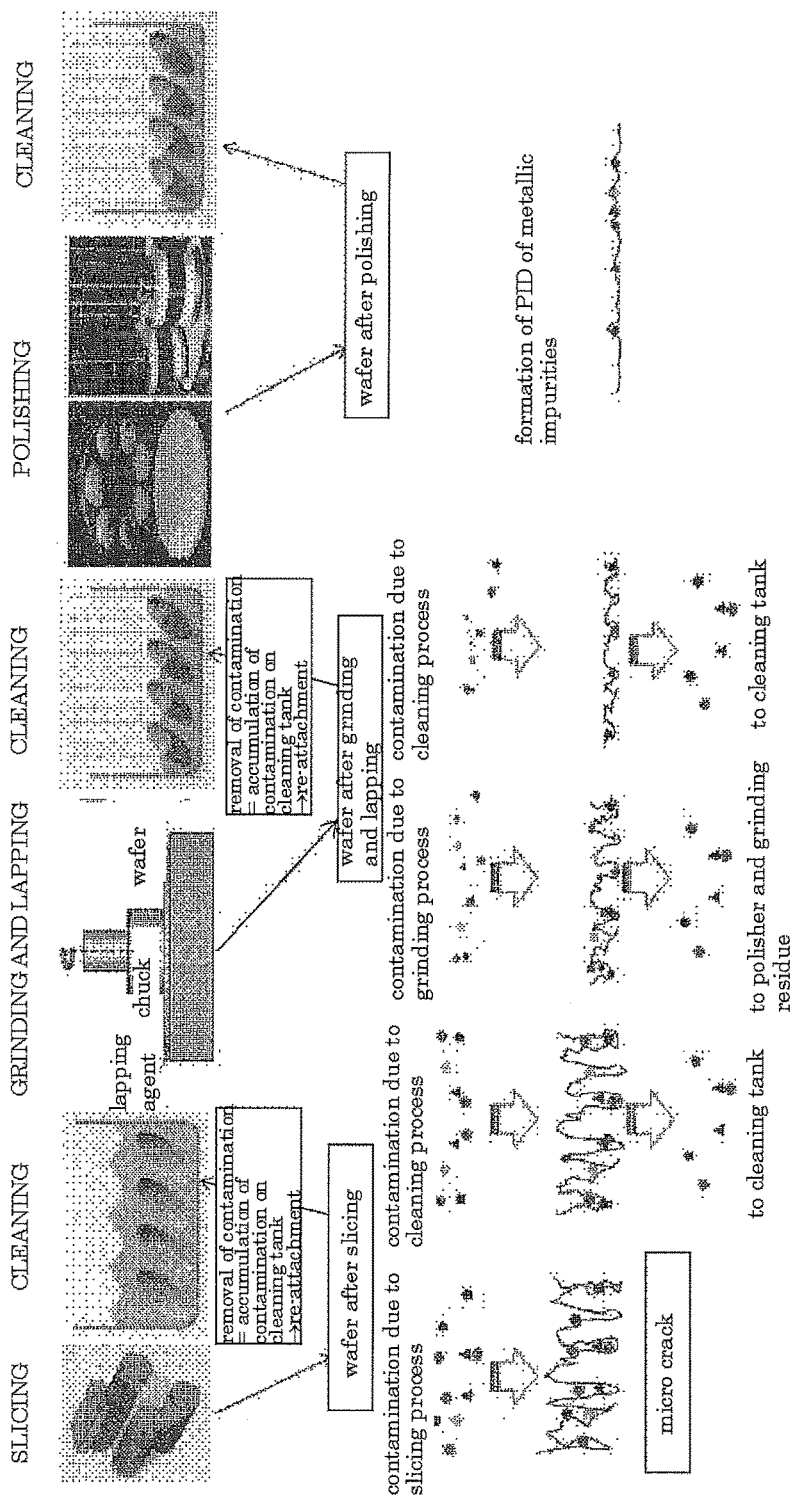
FIG. 6 is an explanatory view of the outline of a mechanism through which metallic impurities are attached to PID.
Figure 7:
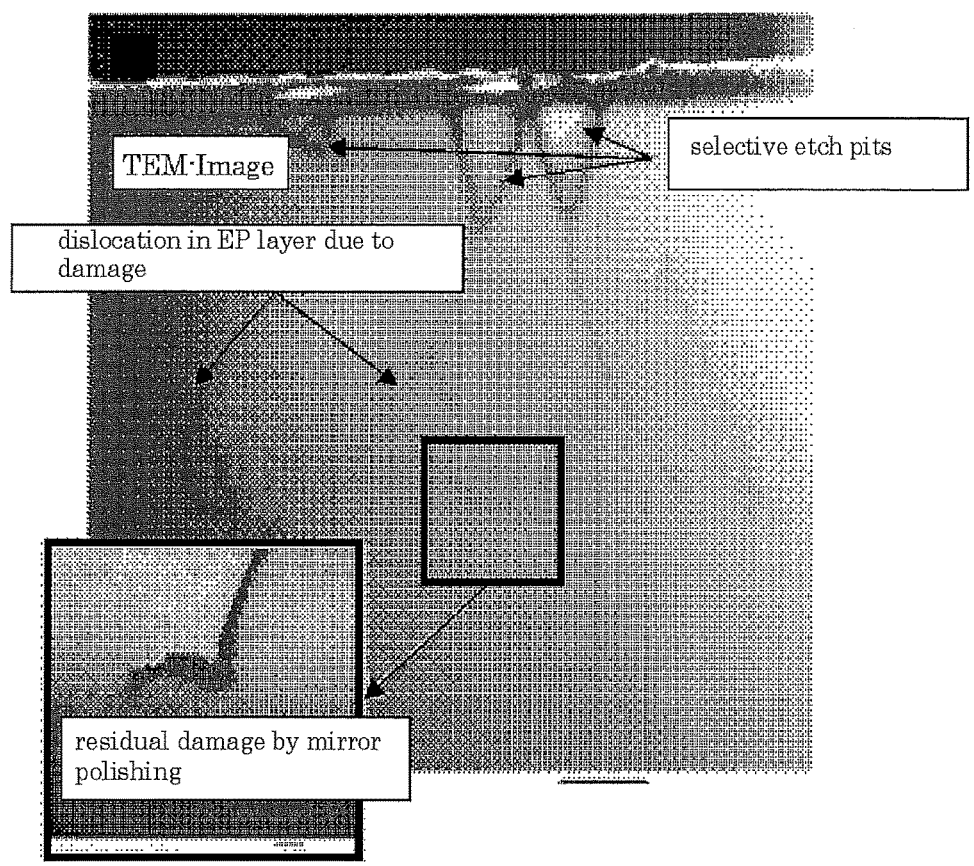
FIG. 7 is an observation diagram of exemplary epitaxial defects in an epitaxial layer.
Figure 8:
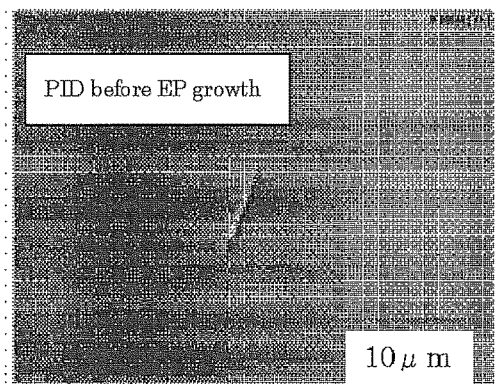
FIG. 8 show an observation diagram of PID on a polished wafer at (A), and an observation diagram of a projection at the same coordinates as the PID after epitaxial growth is performed at (B)
Figure 8:
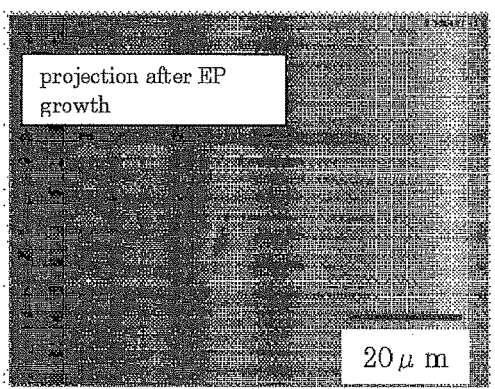
Figure 9:
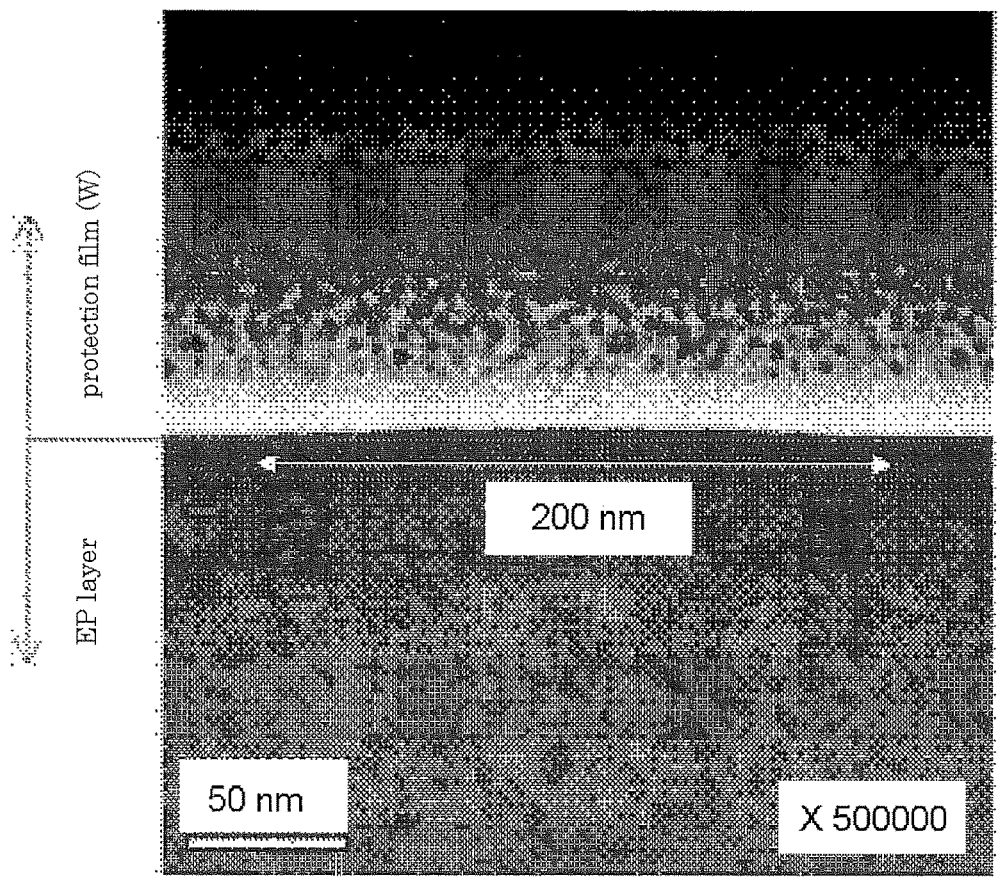
FIG. 9 is an observation diagram of the cross section of an epitaxial layer with a convex shape observed at the same coordinates as PID after epitaxial growth is performed on a silicon wafer having the PID.

FIG. 2 shows the result of this surface inspection. Points in the silicon wafers shown in FIG. 2 indicate defects (PIDs etc.,). As shown in FIG. 2, the number of defects of the silicon wafers after the rough polishing, polished wafers, and epitaxial wafers in the example was 1080, 26, and 7, respectively. The number of defects in the comparative example was 1279, 585, and 225.

In the comparative example, the number of defects of the polished wafer after the final polishing was decreased up to about 45% compared with after the rough polishing. In contrast, the example that implemented the invention exhibited a decrease up to about 3%.

Comparing the number of defects after the epitaxial growth, the comparative example exhibited a decrease up to about 18%; in contrast, the example exhibited a decrease up to about 0.65%. The example was 27 or more times effective than the comparative example.

Thus, the present invention can significantly reduce the number of defects, including PID, compared with the conventional method.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method of polishing a silicon wafer, comprising performing a mirror polishing process on the silicon wafer, the mirror polishing process including:
   performing rough polishing on the silicon wafer; subsequently
   removing metallic impurities attached on a surface of the silicon wafer by performing both an oxidation process with ozone water and an oxide-film removing process with hydrofluoric acid vapor or hydrofluoric acid solution on an entire surface of the silicon wafer; and then
   performing final polishing.

2. The method according to claim 1, wherein the silicon wafer after the removal of the metallic impurities is subjected to an RCA cleaning process.

3. The method according to claim 1, wherein the silicon wafer after the final polishing is subjected to a final cleaning process.

4. The method according to claim 2, wherein the silicon wafer after the final polishing is subjected to a final cleaning process.

5. A method of producing an epitaxial wafer comprising:
   performing the mirror polishing process by the method according to claim 1 on a surface of a silicon wafer; and
   forming an epitaxial layer on the surface of the silicon wafer.

6. A method of producing an epitaxial wafer comprising:
   performing the mirror polishing process by the method according to claim 2 on a surface of a silicon wafer; and
   forming an epitaxial layer on the surface of the silicon wafer.

7. A method of producing an epitaxial wafer comprising:
   performing the mirror polishing process by the method according to claim 3 on a surface of a silicon wafer; and
   forming an epitaxial layer on the surface of the silicon wafer.

8. A method of producing an epitaxial wafer comprising:
   performing the mirror polishing process by the method according to claim 4 on a surface of a silicon wafer; and
   forming an epitaxial layer on the surface of the silicon wafer.

* * * * *